(12) United States Patent
Karanicolas

(10) Patent No.: US 6,838,957 B2
(45) Date of Patent: Jan. 4, 2005

(54) DIFFERENTIAL METAL OXIDE SEMICONDUCTOR CAPACITOR

(75) Inventor: Andrew Karanicolas, San Francisco, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/745,677

(22) Filed: Dec. 21, 2000

(65) Prior Publication Data
US 2002/0079991 A1 Jun. 27, 2002

(51) Int. Cl.⁷ .................... H03H 11/00; H03H 11/48
(52) U.S. Cl. .............. 333/214; 333/216; 327/524; 327/581
(58) Field of Search .................. 333/214, 216; 327/581, 524, 562, 563

(56) References Cited

U.S. PATENT DOCUMENTS

| | | | |
|---|---|---|---|
| 5,926,064 A | | 7/1999 | Hariton .................. 327/581 |
| 5,949,295 A | * | 9/1999 | Schmidt ................ 331/117 R |
| 6,087,896 A | * | 7/2000 | Bazzani ................. 327/581 |
| 6,194,973 B1 | * | 2/2001 | Williamson ............. 331/109 |

OTHER PUBLICATIONS

Jacob Millman, Ph.D.; *Microelectronics Digital and Analog Circuits and Systems*; Publishers:McGraw–Hill Book Company, New York 1979, p. 237.*

* cited by examiner

Primary Examiner—Barbara Summons
(74) Attorney, Agent, or Firm—Seth Z. Kalson

(57) ABSTRACT

According to an embodiment of the present invention, a capacitor comprising field effect transistors and a bias transistor.

12 Claims, 4 Drawing Sheets

DIFFERENTIAL METAL OXIDE SEMICONDUCTOR CAPACITOR

FIELD

Embodiments of the present invention relate to circuits, and more particularly, to capacitors.

BACKGROUND

Metal Oxide Semiconductor (MOS) capacitors are needed in many analog integrated circuit applications requiring high capacitor density. A common approach to realizing a MOS capacitor is shown in FIG. 1. In FIG. 1, nMOSFET (n-Metal Oxide Semiconductor Field Effect Transistor) 102 has source 104 and drain 106 shorted to ground (substrate) 108 to form one plate of a capacitor, and gate 110 serves as the other plate.

In many applications, there is a need for a high density capacitor using a digital CMOS (Complementary Metal Oxide Semiconductor) process in which the voltage difference between the terminals of the capacitor is small. For example, FIG. 2 illustrates operational amplifier (OPAMP) 202, which is part of some larger circuit 222, such as, for example, an analog-to-digital converter, or a communication circuit such as an Ethernet PHY. OPAMP 202 comprises first differential stage 204 and a final output stage comprising nMOSFET 206 biased by current source 210, where the output signal is taken at output port 212 and input signals are applied at input ports 214 and 216. Miller compensation is applied to nMOSFET 206 by connecting capacitor 208 as shown in FIG. 2. Other stages, employing nMOSFETs, pMOSFETs, or both types of transistors, may be present in OPAMP 202, but for simplicity are not shown. The voltage difference between terminals 218 and 220 of capacitor 208 may be small, such as much less than 0.1 volts.

Operating capacitor 102 in its linear range usually requires a voltage difference across its terminals equal to or greater than its threshold voltage. For many process technologies, this threshold voltage is on the order of 0.7 volts. Even for process technologies where native MOS devices are available, the threshold voltage may still be about 0.1 to 0.2 volts. Consequently, using the structure of capacitor 102 in FIG. 1 for capacitor 208 in FIG. 2 may not be suitable.

DESCRIPTION OF EMBODIMENTS

Figure 3:
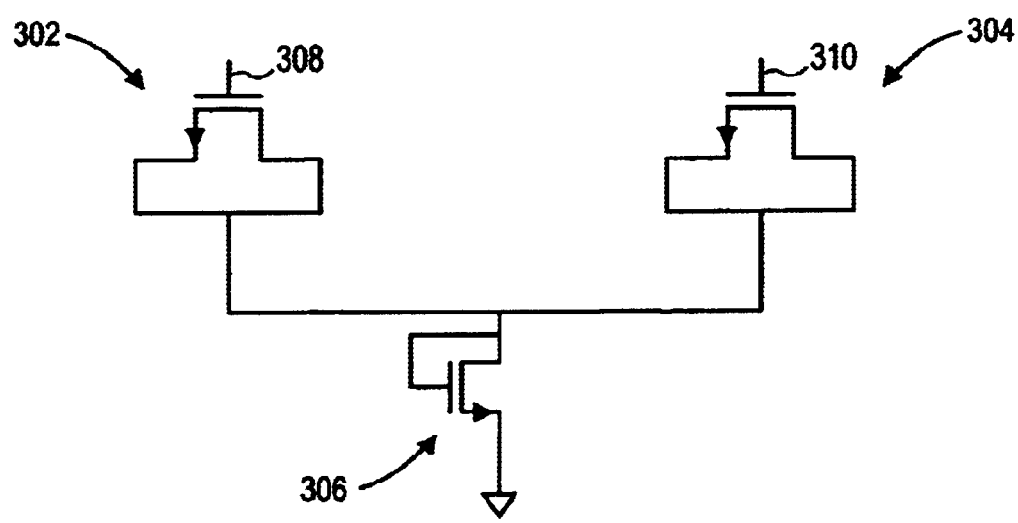
FIG. 3 is a capacitor according to an embodiment of the present invention utilizing nMOSFETs.

FIG. 3 illustrates an embodiment of the present invention, where the source and drains of nMOSFETs 302 and 304 are connected to each other, and are connected to the drain of nMOSFET 306. nMOSFET 306 has its gate connected to its drain, and has its source connected to ground (substrate potential). Gates 308 and 310 of nMOSFETs 302 and 304 comprise the two terminals of the resulting capacitor.

Because in normal operation DC (Direct Current) is not conducted via gates 308 and 310, the DC bias current through nMOSFET 306 is zero. Consequently, the gate-to-source potential difference of nMOSFET 306 is zero, and nMOSFET 306 is OFF. As a result, the circuit of FIG. 3 does not consume DC power, and the impedance between gates 308 and 310 is capacitive.

Figure 1:
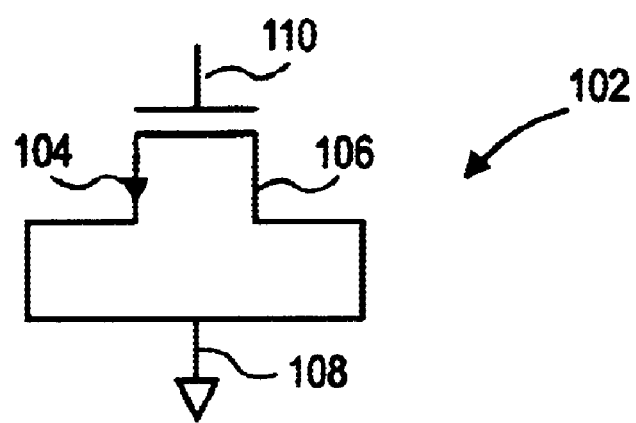
FIG. 1 is a prior art floating MOS capacitor.
Figure 2:
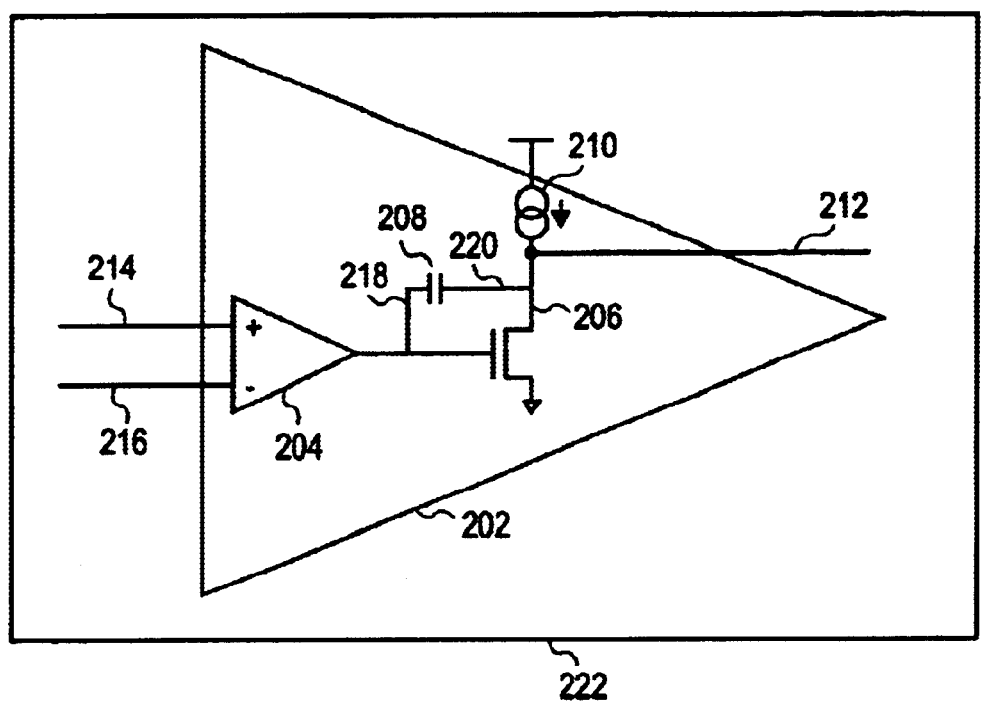
FIG. 2 is a prior art Miller-compensated operational amplifier.

The potential difference between gates 308 and 310 need not necessarily be at the threshold voltage of the nMOSFETs in order for the channels of pMOSFETs 302 and 304 to be in inversion. This is observed by noting that when the gate-to-source potential difference for both nMOSFETs 302 and 304 equals the threshold voltage, the potential difference between gates 308 and 310 is zero. For the Miller compensated output stage of OPAMP 202 in FIG. 2, the gate potential of nMOSFET 206 and the output potential of output port 212 may both be about 0.9 volts, and consequently the embodiment capacitor of FIG. 3 may be used for capacitor 208 of FIG. 2 because 0.9 volts is higher than the threshold voltage for may typical nMOS devices.

Figure 4:
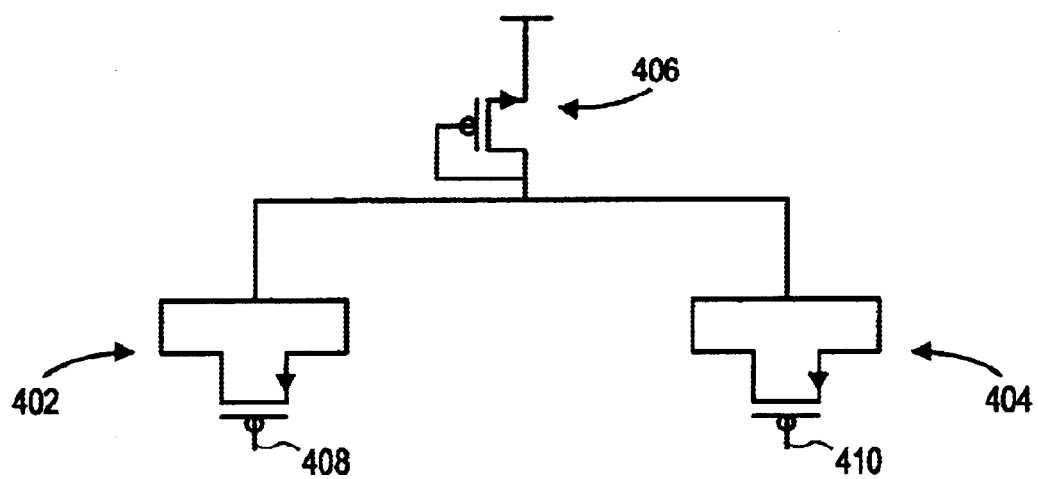
FIG. 4 is a capacitor according to an embodiment of the present invention utilizing pMOSFETs.
Figure 5:
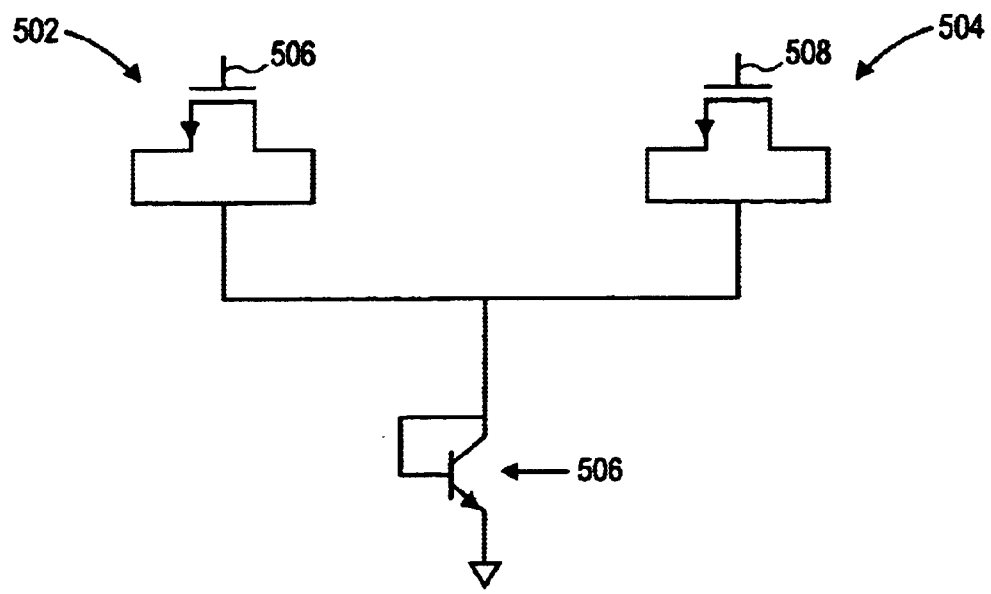
FIG. 5 is a capacitor according to an embodiment of the present invention utilizing nMOSFETs and a npn transistor.
Figure 6:
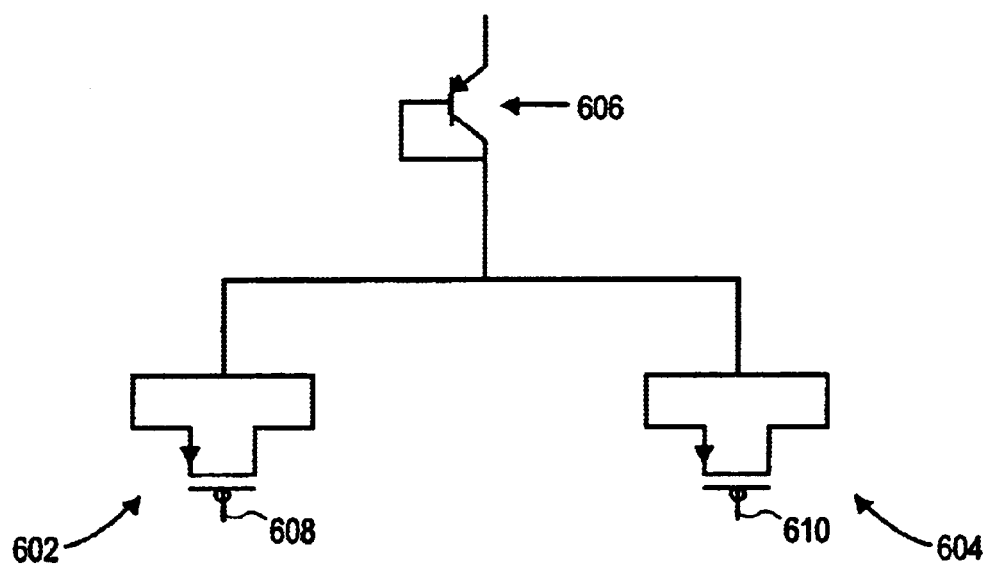
FIG. 6 is a capacitor according to an embodiment of the present invention utilizing pMOSFETs and a pnp transistor.

Other embodiments may utilize pMOSFETs rather than nMOSFETs. For example, in FIG. 4, pMOSFETs 402 and 404 have their sources and drains connected to each other and to the drain of pMOSFET 406, where the gate and drain of pMOSFET 406 are connected to each other. Gates 408 and 410 comprise the two terminals of the resulting capacitor. In other embodiments, bias transistor 306 or bias transistor 406 may be realized by a bipolar transistor. For example, in FIG. 5, nMOSFETs 502 and 504 have their sources and drains connected to the collector of npn transistor 506, where the base and collector of npn transistor 506 are connected to each other. Gates 506 and 508 comprise the terminals of the resulting capacitor. As another example, in FIG. 6 pMOSFETs 602 and 604 have their sources and drains connected to the collector of pnp transistor 606, where the base and collector of pnp transistor 606 are connected to each other. Gates 608 and 610 comprise the terminals of the resulting capacitor. Accordingly, variations and modifications to the disclosed embodiments may be realized without departing from the scope of the invention as claimed below.

I claim:

1. A device comprising:
   a first field effect transistor having a gate, a source, and a drain;
   a second field effect transistor having a gate, a source, and a drain; and
   a bias transistor having a gate, source, and drain;
   wherein the bias transistor and the first and second field effect transistors are coupled to each other so that the sources and drains of the first and second field effect transistors and the gate and drain of the bias transistor have a substantially same voltage potential, and the bias transistor has substantially zero DC bias current.

2. An amplifier comprising:
   an output stage having an output port and an input port; and
   a device comprising:
     a first field effect transistor having a gate, source, and drain;
     a second field effect transistor having a gate, source, and drain; and
     a third field effect transistor having a gate, source, and drain, wherein the sources and drains of the first and second field effect transistors and the drain and gate of the third field effect transistor are all directly connected to each other, wherein the gates of the first and second field effect transistors are not directly connected to each other;

wherein the gate of the first field effect transistor is directly connected to the output port and the gate of the second field effect transistor is directly connected to the input port.

3. The device as set forth in claim 2, wherein the output stage comprises a field effect transistor having a gate and a drain, wherein the gate of the output stage is directly connected to the input port and the drain of the output stage is directly connected to the output port.

4. An amplifier comprising:

an output stage having an output port and an input port; and a device comprising:
 a first field effect transistor having a gate, source, and drain;
 a second field effect transistor having a gate, source, and drain; and
 a bipolar transistor having a base, emitter, and collector, wherein the sources and drains of the first and second field effect transistors and the base and collector of the bipolar transistor are all directly connected to each other, and wherein the gates of the first and second field effect transistors are not directly connected to each other;
 wherein the gate of the first field effect transistor is directly connected to the output port and the gate of the second field effect transistor is directly connected to the input port.

5. The device as set forth in claim 4, wherein the output stage comprises a field effect transistor having a gate and a drain, wherein the gate of the output stage is directly connected to the input port and the drain of the output stage is directly connected to the output port.

6. A communication circuit comprising:

an amplifier comprising a capacitor to provide compensation, the capacitor comprising:
 a first field effect transistor having a gate, a source, and a drain;
 a second field effect transistor having a gate, a source, and a drain; and
 a bias transistor having a gate, source, and drain;
 wherein the bias transistor and the first and second field effect transistors are coupled to each other so that the sources and drains of the first and second field effect transistors and the gate and drain of the bias transistor have a substantially same voltage potential, and the bias transistor has substantially zero DC bias current.

7. A device comprising:

a first field effect transistor having a gate, a source, and a drain;

a second field effect transistor having a gate, a source, and a drain; and a bias transistor having a base, emitter, and collector;

wherein the bias transistor and the first and second field effect transistors are coupled to each other so that the sources and drains of the first and second field effect transistors and the base and collector of the bias transistor have a substantially same voltage potential, and the bias transistor has substantially zero DC bias current.

8. A communication circuit comprising:

an amplifier comprising a capacitor to provide compensation, the capacitor comprising:
 a first field effect transistor having a gate, a source, and a drain;
 a second field effect transistor having a gate, a source, and a drain; and
 a bias transistor having a base, emitter, and collector;
 wherein the bias transistor and the first and second field effect transistors are coupled to each other so that the sources and drains of the first and second field effect transistors and the base and collector of the bias transistor have a substantially same voltage potential, and the bias transistor has substantially zero DC bias current.

9. A device comprising:

a first field effect transistor having a gate, source, and drain;

a second field effect transistor having a gate, source, and drain; and a third field effect transistor having a gate, source, and drain, wherein the sources and drains of the first and second field effect transistors and the drain and gate of the third field effect transistor are all directly connected to each other, and wherein the gates of the first and second field effect transistors are not directly connected to each other.

10. The device as set forth in claim 9, wherein an impedance looking into the gates of the first and second field effect transistors is substantially capacitive.

11. A device comprising:

a first field effect transistor having a gate, source, and drain;

a second field effect transistor having a gate, source, and drain; and a bipolar transistor having a base, emitter, and collector, wherein the sources and drains of the first and second field effect transistors and the base and collector of the bipolar transistor are all directly connected to each other, wherein the gates of the first and second field effect transistors are not directly connected to each other.

12. The device as set forth in claim 11, wherein an impedance looking into the gates of the first and second field effect transistors is substantially capacitive.

* * * * *